(12) United States Patent  
McConnell et al.

(10) Patent No.: US 9,793,057 B2  
(45) Date of Patent: Oct. 17, 2017

(54) ELECTRONIC COMPONENT TERMINATION AND ASSEMBLY BY MEANS OF TRANSIENT LIQUID PHASE SINTERING METALLURGICAL BOND

(71) Applicant: Kemet Electronics Corporation, Simpsonville, SC (US)

(72) Inventors: John E. McConnell, Simpsonville, SC (US); Garry L. Renner, Simpsonville, SC (US); John Bultitude, Simpsonville, SC (US)

(73) Assignee: KEMET Electronics Corporation, Simpsonville, SC (US)

( * ) Notice: Subject to any disclaimer, the term of this patent is extended or adjusted under 35 U.S.C. 154(b) by 5 days.

(21) Appl. No.: 15/149,309

(22) Filed: May 9, 2016

(65) Prior Publication Data  
US 2016/0254097 A1    Sep. 1, 2016

Related U.S. Application Data

(60) Division of application No. 14/193,293, filed on Feb. 28, 2014, which is a continuation-in-part of (Continued)

(51) Int. Cl.  
*H01G 9/00* (2006.01)  
*H01G 9/07* (2006.01)  
(Continued)

(52) U.S. Cl.  
CPC .......... *H01G 9/0032* (2013.01); *B23K 1/008* (2013.01); *B23K 1/0016* (2013.01); *B23K 1/0053* (2013.01); *B23K 1/203* (2013.01); *B23K 35/0227* (2013.01); *B23K 35/286* (2013.01); *B23K 35/3613* (2013.01); *H01G 4/005* (2013.01); *H01G 4/2325* (2013.01); *H01G 4/30* (2013.01); *H01G 9/008* (2013.01); *H01G 9/0029* (2013.01); *H01G 9/045* (2013.01); *H01G 9/07* (2013.01); *B23K 2201/42* (2013.01); *H01L 2224/83825* (2013.01);  
(Continued)

(58) Field of Classification Search  
CPC .... H01G 9/0032; H01G 9/0029; H01G 9/008; H01G 9/045; H01G 9/07  
See application file for complete search history.

(56) References Cited

U.S. PATENT DOCUMENTS 8,902,565 B2 * 12/2014 McConnell ................ 361/306.3  
2011/0292567 A1 * 12/2011 McConnell .......... B23K 1/0016  
361/321.2

(Continued)

*Primary Examiner* — Seahvosh Nikmanesh  
(74) *Attorney, Agent, or Firm* — Joseph T. Guy; Perkins Law Firm, LLC

(57) ABSTRACT

An improved method for forming a capacitor is provided as is a capacitor, or electrical component, formed by the method. The method includes providing an aluminum containing anode with an aluminum oxide dielectric thereon; forming a cathode on a first portion of the aluminum oxide dielectric; bonding an anode lead to the aluminum anode on a second portion of the aluminum oxide by a transient liquid phase sintered conductive material thereby metallurgical bonding the aluminum anode to the anode lead; and bonding a cathode lead to said cathode.

20 Claims, 10 Drawing Sheets

Related U.S. Application Data application No. 13/114,126, filed on May 24, 2011, now Pat. No. 8,902,565.

(60) Provisional application No. 61/348,318, filed on May 26, 2010.

(51) Int. Cl.

| | |
|---|---|
| *H01G 9/008* | (2006.01) |
| *H01G 9/045* | (2006.01) |
| *B23K 1/00* | (2006.01) |
| *B23K 1/005* | (2006.01) |
| *B23K 1/008* | (2006.01) |
| *B23K 1/20* | (2006.01) |
| *B23K 35/36* | (2006.01) |
| *B23K 35/02* | (2006.01) |
| *H01G 4/30* | (2006.01) |
| *H01G 4/005* | (2006.01) |
| *H01G 4/232* | (2006.01) |
| *B23K 35/28* | (2006.01) |
| *B23K 101/42* | (2006.01) |

(52) U.S. Cl.
CPC ............ *H01L 2924/01322* (2013.01); *H01L 2924/01327* (2013.01); *H01L 2924/10253* (2013.01); *H01L 2924/1461* (2013.01); *Y10T 29/435* (2015.01)

(56) References Cited

U.S. PATENT DOCUMENTS

| | | | | |
|---|---|---|---|---|
| 2013/0314845 | A1* | 11/2013 | Chacko | H01G 9/04 361/502 |
| 2014/0002952 | A1* | 1/2014 | McConnell | B23K 1/0016 361/301.4 |
| 2014/0177132 | A1* | 6/2014 | McConnell | B23K 1/0016 361/305 |
| 2017/0025223 | A1* | 1/2017 | Bultitude | H01G 4/30 |

* cited by examiner

ELECTRONIC COMPONENT TERMINATION AND ASSEMBLY BY MEANS OF TRANSIENT LIQUID PHASE SINTERING METALLURGICAL BOND

CROSS-REFERENCE TO RELATED APPLICATIONS

The present application is a divisional application of pending U.S. patent application Ser. No. 14/193,293 filed Feb. 28, 2014 which is, in turn, a Continuation-In-Part application of issued U.S. patent Ser. No. 13/114,126 filed May 24, 2011 now U.S. Pat. No. 8,902,565 issued Dec. 2, 2014 which, in turn, claims priority to U.S. Provisional Patent Application No. 61/348,318 filed May 26, 2010 all of which are incorporated herein by reference.

BACKGROUND

The present invention is related to electronic components and methods of making electronic components. More specifically, the present invention is related to electronic components, and methods of making electronic components, with improved terminations for attachment of an external lead or lead frame to the electronic component such that the component can subsequently be connected to an electronic circuit or as a thermal heat sink bond to an aluminum or aluminum alloy heat sink.

In general, the method of formation of a conductive termination, and materials used, is critical for reliable performance. The performance in use, when subsequently assembled in an electronic circuit, is directly related to the conductive termination. Historically, lead (Pb) based solders have been used to attach components to electronic circuit boards or to attach external leads to the electronic component. More recently, the use of hazardous substances in electrical and electronic equipment, as typified by the European RoHS legislation, has restricted the use of lead (Pb) in solder and has led the industry to seek various alternatives.

U.S. Pat. No. 6,704,189, for example, describes the use of Sn based solder with 10-30% Sb to form a contact between external leads and plated Multi-Layer Ceramic Capacitor (MLCC) components. However, the solders described have a liquidous below 270° C. By way of comparison, high-Pb solders such as Sn10/Pb88/Ag2 have a liquidous of about 290° C. It is generally recognized in the industry that a melting point 30° C. above any subsequent processing temperature is desirable to insure reliability of the external lead attachment. The ability to achieve high melting points has become critical since solders based on Sn, Ag and Cu, which are referred to in the art as SAC solders, are now becoming the common choice for attachment in Pb-free circuits. SAC solders have to be reflowed at higher temperatures, typically about 260° C., than the older Pb-based alternatives such as Sn63/Pb37 which had a melting point of 183° C. The contact material to the external lead, or for forming the terminal, must be capable of sustaining temperatures well above this in order not to melt, or partially melt, which causes significant reliability issues. A temperature of at least 30° C. above the melting point of the SAC solder is desired.

U.S. Pat. No. 5,038,996 describes coating two mating surfaces, one with Sn and the other with Pb, and forming a joint by raising the process temperature to a temperature slightly below Sn (183° C.). Transient Liquid Phase Sintering conductive formulations disclosed in U.S. Pat. No. 5,853,622 combine TLPS materials with cross linking polymers to create a thermally and electrical bond having intermetallic interfaces between the metal surfaces created by the TLPS process. The spraying of one mating surface with a low temperature melting material and the mating surface with a higher melting temperature material and being compatible with the TLPS process and forming a joint when heating to the melting point of the lower temperature material is discussed in U.S. Pat. No. 5,964,395. These patents describe the materials and processes of TLPS with respect to forming a conductive bond.

U.S. Pat. No. 5,221,038 claims the use of SnBi or SnIn for soldering discrete components such as resistors and the like to printed circuit boards using the TLPS process. The use of Ag/SnBi coated to two mating surfaces to mount electronic modules to substrates was disclosed in U.S. Pat. No. 6,241,145. US Patent Application No. 2002/0092895 A1 discusses the deposition of materials on two mating surfaces, a substrate and the surface of the bumps on a flip chip, elevated to a temperature to cause diffusion between the materials to create a TLPS compatible alloy. US Patent Application No. 2006/0151871 describes the use of TLPS in forming packages containing SiC or other semiconductor devices bonded to other components or conductive surfaces. US Patent Application No. 2007/0152026 A1 claims the placement of TLPS compatible materials on mating surfaces then reflowing the lower melting point material and then isothermally aging to complete the diffusion process where the two devices to be joined are a MEMS device to a microelectronic circuit. U.S. Pat. No. 7,023,089 B1 claims the use of TLPS to bond heat spreaders made from copper, black diamond, or black diamond copper composite to silicon die. These patents and applications describe the processing of TLPS to bond components to circuit boards but do not contain any teaching regarding their use to form terminations on electronic components or in the attachment of components to lead frames.

In a more recent development US Patent Application No. 2009/0296311 A1 describes a high temperature diffusion bonding process that welds the lead to the inner electrodes of a multi-layer ceramic component. TLPS materials are plated on the faces of mating surfaces to be joined together by introducing heat to initiate the diffusion process. In this case an intimate mutual line of contact is required between the component and lead frame to facilitate the diffusion. This limits the application to the joining of surfaces that can form an intimate line of contact and also cannot accommodate components of differing length. Furthermore, high temperatures in the range 700 to 900° C. are described to achieve a welded bond that requires pre-heating in order not to damage the multi-layer ceramic component.

Other Pb free attachment technologies are described in the art yet none are adequate.

Solder is an alloy consisting of two or more metals that have only one melting point, which is always lower than that of the metal having the highest melting point and generally, a melting point of less than about 310° C., depending on the alloy. Solder can be reworked, meaning it can be reflowed multiple times, thus providing a means to remove and replace defective components. Solders also make metallurgical bonds by forming intermetallic interfaces between the surfaces they are joining. As solders wet to their adjoining surfaces, they actually flow outward and spread across the surface areas to be joined.

Due to environmental issues associated with lead; tin, silver, and copper solders known as lead free SAC solders were developed for electronics but these are typically reflowed at peak temperatures around 260° C. and the electronic components therefore have to be operated below this temperature. Due to materials compatibility and higher processing temperatures involved with the semi-conductor technologies, gold/germanium and gold/tin alloys were developed to attach dies to substrates. Since the die and their mating surfaces have a low difference in thermal coefficient of expansion TCE, these alloys provide high temperature capabilities and high strengths having tensile strengths in the range of 20,000 psi+ and shear strengths in the range of 25,000 psi+. However, these materials also require higher processing temperatures due to their higher melting points, generally above 350° C. Their high cost and limited application has prevented their wider use in electronics. Tin and indium have been added to combinations of Zn, Al, Ge and Mg to form higher temperature lead free solders. However, zinc and aluminum powder tend to form oxide films on the surface resulting in poor wettability in the subsequent solders making them impractical to use. Solders with tin, zinc, cadmium, and aluminum are available but typically used in their eutectic alloy form because their alloys, other than eutectics, have wide plastic ranges of 50-175° C. thereby limiting their use to very specific applications outside of the electronics. Cadmium, zinc, and silver alloy solders are good for soldering aluminum or aluminum alloy. Once the liquidus temperatures move above about 450° C. the solders are referred to as brazing solders and are typically used in structural applications rather than electrical applications. Methods of forming Pb-free, high temperature bonds to capacitors that retain their integrity above 260° C. and which are economic to manufacture have therefore yet to be realized.

A particular problem in the art is associated with soldering of aluminum conductors such as aluminum anodes, aluminum cathodes or aluminum heat sinks to other aluminum conductors or to leads. Aluminum is known to form a surface oxide almost immediately in normal air and it is difficult to form a metallurgical bond through the oxide. Those of skill in the art have been forced to utilize fluxes in solders wherein the fluxes are defined herein as materials which remove the oxides and allow for adequate bond formation. Unfortunately, the components of the flux remain as impurities in the bond which is detrimental to the bond resulting in a lower bond density. There has been no adequate solution to this problem thereby limiting the applications which can rely on the electrical and thermal advantages of aluminum.

In spite of the ongoing, and intensive effort, the art still lacks an adequate solution for attaching external leads or lead frames to a multi-layered ceramic capacitor. There is an ongoing need for lead connections with improved reliability for high temperature applications, especially lead(Pb) free and especially with aluminum.

SUMMARY OF THE INVENTION

It is an object of the invention to provide an improved method for forming metallic external terminals, or for attachment to a lead frame, which can be reflowed without compromising the metallic external leads or lead frame attachment during subsequent assembly into an electronic circuit.

It is a particular object of the invention to provide a method for forming metallic external terminals directly to aluminum without removal of the oxide and without the necessity of fluxes.

These and other embodiments, as will be realized, are provided in a multilayered ceramic capacitor. The capacitor has first planer internal electrodes, and in an embodiment aluminum internal electrodes, in electrical contact with a first external termination. Second planer internal electrodes are interleaved with the first planer internal electrodes wherein the second planer internal electrodes are in electrical contact with a second external termination. A dielectric is between the first planer internal electrodes and the second planer internal electrodes and at least one of the external terminations comprises a transient liquid phase sintering metallurgical bond.

Another embodiment is provided in a multilayered ceramic capacitor. The capacitor has first planer internal electrodes, and in an embodiment aluminum internal electrodes, terminating at a first external termination and second planer internal electrodes interleaved with the first planer internal electrodes wherein the first planer internal electrodes terminate at a second external termination. A dielectric is between the first planer internal electrodes and the second planer internal electrodes. A first lead frame is in electrical contact with the first external termination wherein the first lead frame is attached to the first external termination by a transient liquid phase sintering metallurgical bond.

Yet another embodiment is provided in a method for forming a multilayered ceramic capacitor. The method comprises:
forming a monolith comprising:
first planer internal electrodes, and in an embodiment aluminum internal electrodes, terminating at a first external termination;
second planer internal electrodes interleaved with the first planer internal electrodes wherein the first planer internal electrodes terminate at a second external termination; and
a dielectric between said first planer internal electrodes and said second planer internal electrodes;
providing a lead frame comprising a first lead and a second lead;
attaching the first lead to the first external termination with a transient liquid phase sintering metallurgical bond;
and attaching the second lead to the second external termination with the metallurgical bond.

Yet another embodiment is provided in a method for forming an electronic circuit. The method comprises the steps of: forming a multilayered ceramic capacitor comprising: forming a monolith comprising: first planer internal electrodes terminating at a first external termination; second planer internal electrodes interleaved with the first planer internal electrodes wherein the first planer internal electrodes terminate at a second external termination; a dielectric between the first planer internal electrodes and the second planer internal electrodes; providing a lead frame comprising a first lead and a second lead; attaching the first lead to the first external termination with a transient liquid phase sintering metallurgical bond; and attaching the second lead to the second external termination with the metallurgical bond; and attaching the multilayered ceramic capacitor to a circuit trace.

Yet another embodiment is provided in a method for forming a capacito. The method includes providing an aluminum containing anode with an aluminum oxide dielectric thereon; forming a cathode on a first portion of the aluminum oxide dielectric; bonding an anode lead to the aluminum anode on a second portion of the aluminum oxide by a transient liquid phase sintered conductive material thereby metallurgical bonding the aluminum anode to the anode lead; and bonding a cathode lead to said cathode.

Yet another embodiment is provided in an MLCC. The capacitor has a first planer internal aluminum or aluminum alloy electrodes in electrical contact with a first external termination. Second planer internal aluminum or aluminum alloy electrodes interleaved with the first planer electrodes wherein the second internal electrodes are in electrical contact with a second external termination. A dielectric is between the first planer internal electrodes and the second planer internal electrodes. At least one of the first external termination or the second external termination comprises a transient phase sintering metallurgical bond.

Yet another embodiment is provided in an electrical component. The electrical component comprises an aluminum or aluminum alloy layer; a lead in contact with the aluminum or aluminum alloy layer; and wherein the contact comprises a metallurgical bond with the aluminum or aluminum alloy layer wherein the metallurgical bond comprises transient liquid phase sintering material.

Yet another embodiment is provided in an MLCC. The MLCC comprises first planer internal electrodes in electrical contact with a first external termination wherein the first external termination comprises aluminum or aluminum alloy; second planar internal electrodes area interleaved with the first planer electrodes wherein the second internal electrodes are in electrical contact with a second external termination. A dielectric is between the first planer internal electrodes and the second planer internal electrodes. A first lead is in electrical contact with the first external termination. Wherein the first external termination is attached to the first lead by a transient liquid phase sintering material.

DETAILED DESCRIPTION

Figure 1:
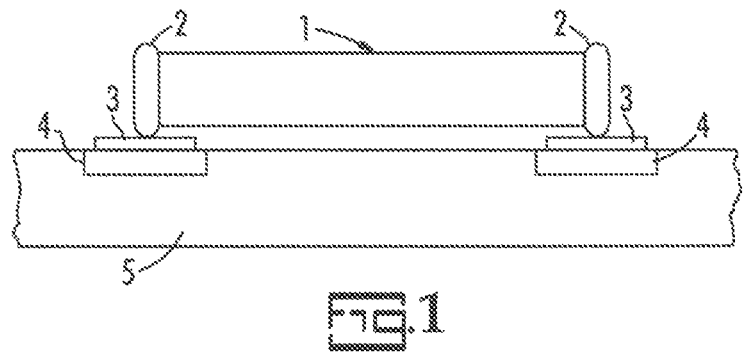
FIG. 1 is a side schematic view of an embodiment of the invention.

The present invention is related to a capacitor with improved bonding to an external lead or lead frame. More specifically, the present invention is related to the use of transient liquid phase sintering materials, preferably as a paste, to form a termination to the component or to attach external leads to the component by a metallurgical bond. The improved terminations have the advantage of being able to accommodate different surface finishes as well as components of differing lengths. Furthermore, since no solder balls are formed the components can be stacked on top of each other without the gaps normally required for cleaning as with solder attachment technology. The transient liquid phase sintering metallurgical bond can be directly formed with the inner electrodes of the component and the termination can be formed at low temperature. In a preferred embodiment higher density terminations can be prepared by using a thermo-compression process thereby forming improved external lead attachment bonds. Even more specifically the present invention is related to improvements in bonding to aluminum or aluminum alloy either by forming an aluminum-alloy-aluminum bond or as a metallurgical bond between aluminum or aluminum alloy and other metals and even more particularly in the ability to bond to aluminum or aluminum alloy without prior oxide removal.

Throughout the specification the term aluminum is intended to refer equally to aluminum alloy unless stated otherwise.

Transient liquid phase sintering materials (TLPS) are conductive materials that are distinguished from solders. Solders are alloys which do not undergo a change in composition after the first reflow. TLPS materials are mixtures of two or more metals or metal alloys prior to exposure to elevated temperatures. The second distinguishing characteristic of TLPS materials is that the melting point of the material is dependent on the thermal history of the material. TLPS materials exhibit a low melting point prior to exposure to elevated temperatures, and a higher melting point following exposure to these elevated temperatures. The initial melting point is the result of the low temperature metal or an alloy of two low temperature metals. The second melting temperature is that of the intermetallic formed when the low temperature metal or alloy, forms a new alloy with a high temperature melting point metal thereby creating an intermetallic having a higher melting point. TLPS materials form a metallurgical bond between the metal surfaces to be joined. Unlike tin/lead or lead (Pb) free solders, the TLPS conductive metallurgical bonds do not spread as they form the intermetallic joint. Rework of the TLPS system is very difficult due to the high secondary reflow temperatures. In a particularly preferred embodiment the TLPS conductive metallurgical bond for use with bonding aluminum has at least 90% by weight metal with the balance being those materials necessary to form a paste or to make the TLPS workable. More preferably the TLPS has at least 95 wt % metal. Above about 98 wt % metal the TLPS is not easily worked or formed into the desired configuration.

A TLPS material or paste can form a termination on an electronic component that can subsequently be attached to an electronic circuit by other methods and/or materials. A metallurgical intermetallic bond is formed that can be lead (Pb) free and which has improved joint strength compared to other material types such as Pb-free solder at elevated temperatures. The TLPS joint may be made directly with a buried electrode or electrodes within the component or through other materials in contact with these electrodes. The TLPS joint does not have to overlap the edge of the component.

The use of TLPS in paste form allows uneven surfaces to be joined. More specifically, the use of TLPS in paste form allows two irregular shaped surfaces to be joined with no intimate, or continuous, line of contact. This is particularly advantageous compared to plated surfaces that are subsequently diffusion bonded where the surfaces have to be in an intimate continuous line of contact during this process. This also allows electronic components of differing lengths to be combined within a stack or stacked within a lead frame. Since the transient liquid sintering phase conductive material does not form solder balls the stacked components can be placed on top of one another with the terminations in the same orientation and with no gaps required for cleaning as needed in conventional attachment using solder.

Since the TLPS pastes do not flow like a conventional solder there is no need to employ solder dams on the lead frames. This feature provides a significant manufacturing convenience.

The TLPS paste can be used to form metallurgical bonds between 2 or more components to each other or within a common lead frame. In the case of the lead frame, components of different lengths can be attached and there is no need for gaps between the components to clean solder balls since these do not occur. The resulting stacks are therefore thinner than if assembled with conventional solder. TLPS eliminates solder balls.

In some cases it may be desirable to apply the pastes to either surface being joined. With TLPS paste thermo-compression bonding can be used to increase densities in the bond thereby forming more reliable joints than when relying on temperature alone. Both the mechanical properties and electrical properties are improved by thermo-compression bonding.

Transient liquid sintering phase conductive material can be used to form a metallurgical bond to the inner electrode of the electronic component. This is particularly beneficial when the component is a multi-layer ceramic capacitor since this does not require other materials to be attached prior to forming the termination or metallurgical bond to an external lead or lead frame.

It is particularly preferred that a low temperature be used to form an initial metallurgical bond between the transient liquid phase sintering conductive material and a component. Formation of the initial bond is followed by isothermal aging to generate a high temperature joint capable of sustaining higher temperatures. The reflow temperatures occur during attachment of the component to a circuit using a secondary attachment process and are less than the melt temperature of the alloy formed during the heating to form the initial bond. This is favorable compared to SAC type solder that requires a reflow of about 260° C.

A two step reflow can be also used with transient liquid phase sintering conductive materials wherein in the first step an electrically conductive metallurgical bond is formed at low temperature using a relatively short time cycle, in the range of 5 seconds to 5 minutes, and low temperature, in the range of 180° C. to 280° C., depending on the metals being used in the TLPS alloying process. In the second step the part is subjected to an isothermal aging process using a temperature range of 200° C. to 300° C., for some TLPS combinations, for a longer duration such as, but not limited to, 5 minutes to 60 minutes. The shorter times required to form the initial metallurgical bond are well suited for an automated process. In another method a single step process can be used wherein the transient liquid phase sintering conductive material forms a terminal, or conductive, metallurgical bond between the external leads and electronic component(s) at temperatures of, for example, 250° C. to 325° C. for a duration of, for example, 10 seconds to 30 seconds. Lower temperatures, such as 175° C. to 210° C., can be used for a longer duration, such as 10 to 30 minutes. This is particularly useful when the electronic component itself is sensitive to temperature.

Typically, the transient liquid phase sintering conductive metallurgical bonds are cured, preferably by heating, using a one step sintering process making an electrically conductive metallurgical bond at a temperature range of, but not limited to, 190° C. to 220° C., for a time of, but not limited to, 10 minutes to 30 minutes. It is most preferred that the second melt temperature exceed the first melt temperature by at least 80° C. The metallurgical bond can have a second melting temperature in excess of 400° C., thus making this technology a viable option for a low temperature processing lead (Pb) free solution suitable for use in subsequent high temperature applications. However, this type of process is more suited for batch type processes typical of semiconductor processing and some PCB processing but it is not conducive for high volume in-line termination and external lead attachment for electronic components including multi-layer ceramic capacitors. Furthermore, forming transient liquid phase sintering conductive metallurgical bonds in this way can result in a high degree of porosity particularly with high levels of organic content which is preferably avoided as discussed elsewhere herein.

Transient liquid phase sintering conductive materials can be processed using a two step process to achieve favorable interconnect joints. The first step forms a robust electrically conductive metallurgical joint in a relatively short process time of 30 seconds or less at a temperature in the range of 225° C. to 300° C. The second step is a sintering step that subjects the parts to a temperature of 200° C. to 250° C., or less, for a time of 5 minutes to 30 minutes to complete the alloying process. The two step process is satisfactory for high volume in-line assembly where a subsequent batch sintering process is acceptable. However, as with the aforementioned single step process the porosity is often undesirably high.

In many applications a high degree of porosity may be acceptable. However, in harsh environments, such a high humidity or in circuit board mounting processes, high porosity is not desirable since water or other chemicals may penetrate through the bond and may cause the component to fail. A preferred embodiment of this invention is therefore to form a low porosity, or high density, termination with a transient liquid phase sintering conductive metallurgical bond using a thermo-compression bonding process. This process has the added advantage of using a low process time of 15 to 30 seconds at a temperature in the range of 225° C. to 300° C. in a single step making it suitable for automation. Robust joints can be created for the application of attaching external leads to MLCC's using a transient liquid phase sintering conductive material with a one step low temperature in less than 30 seconds and in combination with thermo-compression bonding.

A compressive force of 0.5 to 4.5 Kilograms/cm$^2$ (7.1 to 64 psi) and more preferably 0.6 to 0.8 Kilograms/cm$^2$ (8.5 to 11 psi) is sufficient for demonstration of the thermo-compression teachings herein. About 0.63 Kilograms/cm$^2$ (9 psi) is a particularly suitable pressure for demonstration of the teachings.

TLPS comprise high temperature materials selected from copper, silver, aluminum, gold, platinum, palladium, beryllium, rhodium, nickel, cobalt, iron and molybdenum or a mixture or any combination thereof are suitable for use in transient liquid phase sintering conductive material. The lead(Pb) free transient liquid phase sintering material preferably use either silver or copper as the high temperature component and a tin-bismuth alloy as the low temperature component.

TLPS further comprises low temperature materials selected from tin, antimony, bismuth, cadmium, zinc, gallium, indium, tellurium, mercury, thallium, selenium or polonium or a mixture or an alloy of any two or more of these.

When aluminum is to be bonded a copper tin alloy is the preferred TLPS material. The copper tin alloy preferably has a copper/tin portion representing at least 60 wt % of the TLPS and comprising at least 10 wt % copper to 70 wt % copper and 30 wt % tin to 90 wt % tin. The secondary fraction, which is up to 40 wt % of the TLPS, is a material selected from silver, aluminum, gold, platinum, palladium, beryllium, rhodium, nickel, cobalt, iron, molybdenum, antimony, bismuth, cadmium, zinc, gallium, indium, tellurium, mercury, thallium, selenium, polonium, or an inert material selected from non-volatile fillers such as ceramics, glasses and polymers with high melting points such as above 300° C. While not limited to any theory, the copper and tin are not impeded by aluminum oxide from forming a metallurgical bond to aluminum or between adjacent aluminum faces to form a metallurgical bond with uncharacterized metallurgical content in the bond. This application is particularly suitable when applied to aluminum electrolytic capacitors and when making electrical connection between an anode and an aluminum foil or to an aluminum heat sink. The anode lead may be attached to the aluminum using a copper tin paste with sintering thereby creating a copper aluminum intermetallic phase which is a metallurgical and electrical connection. Since bonding to aluminum can be formed without the use of fluxes a higher bond density can be achieved than previously considered feasible. As known in the art fluxes typically become an impurity or, even if they can be removed, create voids in the metallurgical bond both of which detrimentally impact the metallurgical bond by decreasing the bond density. Though this was previously known to be a detriment it was not known that a TLPS material can be used without flux with aluminum and the aluminum oxide does not interfere with the formation of a metallurgical bond.

The transient liquid phase sintering conductive materials are compatible with surface finishes containing silver, tin, gold, copper, platinum, palladium, nickel, or combinations thereof, either as lead frame finishes, component connections or inner electrodes to form an electronically conductive metallurgical bond between two surfaces. Suitable external lead or lead frame materials include phosphor bronze, copper, alloys of copper such as but not limited to beryllium copper, Cu194 and Cu192, as well as lead frames consisting of ferrous alloys such as but not limited to Alloy 42 and Kovar. Aluminum is suitable for use as a lead frame in the instant invention wherein a metallurgical bond can be formed between the aluminum lead frame and an external termination by TLPS.

Heating can be done by any method known in the art with convection heating, radiant heating and induction heating being most preferred.

The invention will be described with reference to the figures which form an integral, non-limiting, component of the disclosure. Throughout the various figures similar elements will be numbered accordingly.

An embodiment of the invention will be described with reference to the cross-sectional side view in FIG. 1. In FIG. 1, an electronic component, 1, such as an MLCC, comprises terminations, 2, of transient liquid phase sintering material. The termination is attached to contact pads, 4, on an electronic circuit board substrate, 5, using a secondary attachment material, 3. It can be seen that in this way electronic components with many terminations formed with transient liquid phase sintering metallurgical bonds can be attached to a circuit.

Figure 2:
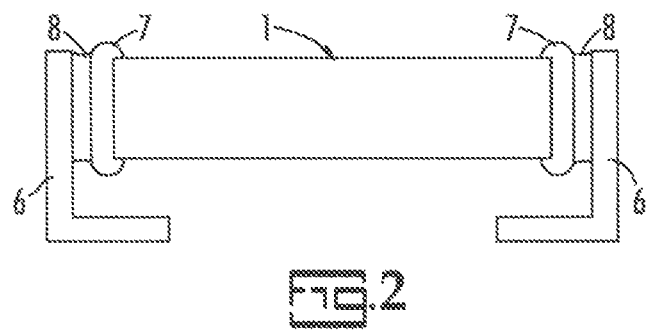
FIG. 2 is a side schematic view of an embodiment of the invention.

The use of the transient liquid phase sintering conductive metallurgical terminations to form a conductive bond to an external lead is shown in FIG. 2 wherein the electronic component, 1, is connected to an external lead or lead frame, 6, with a transient liquid phase sintering metallurgical bond, 8, between the external lead frame and external termination, 7.

Figure 3:
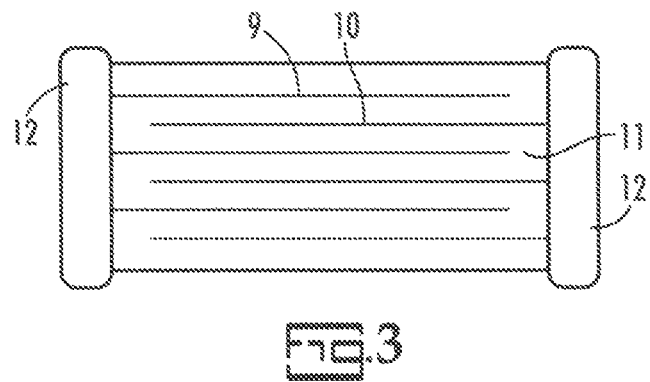
FIG. 3 is a cross-sectional schematic view of an embodiment of the invention.

In FIG. 3, transient liquid phase sintering conductive metallurgical bond as external terminals, 12, are in direct contact with the inner electrodes, 9 and 10, of a multi-layer ceramic capacitor. The interleaved planer inner electrodes of alternating polarity are separated by a dielectric, 11, and alternating inner electrodes are in direct contact with opposing external terminations, 12, formed by the transient liquid phase sintering conductive metallurgical bonds. This embodiment provides an additional benefit of avoiding the processing costs associated with forming other connecting materials on the electronic component. The inner electrodes can be a base metal or precious metal as known in the art depending on the ceramic employed. In a particularly preferred embodiment the inner electrodes can be aluminum. MLCC's with aluminum anodes were previously considered to be unavailable due to the difficulty associated with termination. With an MLCC termination is made primarily with the edge of the inner electrode. If fluxes are required, as would be considered necessary with aluminum, the surface area for bonding would be compromised and any bond formed would be porous and ineffective. Therefore, those of skill in the art have not contemplated MLCC with aluminum inner electrodes. With the instant invention such a structure can be achieved since the aluminum internal electrode can be bonded with TLPS, as described elsewhere herein, without prior removal of the oxide and yet a metallurgical bond can be formed directly to the inner electrodes. Throughout the description inner electrodes of an MLCC include aluminum with a metallurgical bond formed thereto with TLPS.

Figure 4:
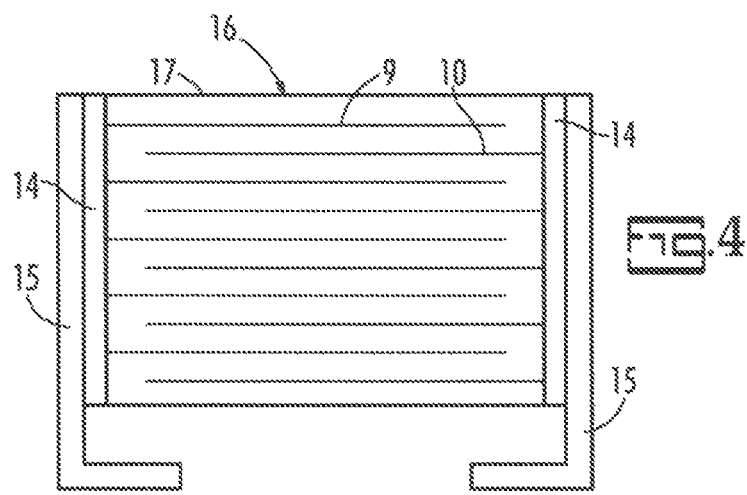
FIG. 4 is a cross-sectional schematic view of an embodiment of the invention.

In FIG. 4 a transient liquid phase sintering conductive metallurgical bond, 14, is formed with an external lead, 15, bonded to the inner electrodes, 9 and 10, and neither the external lead nor the metallurgical bond extends past the edge, 17, of the multi-layer ceramic capacitor body, 16. This embodiment reduces the amount of materials required for terminations and the failures that occur at this overlap area due to mechanical stress are eliminated. In FIG. 4, the inner electrodes, or external lead, may be aluminum with the TLPS bond forming a metallurgical bond thereto.

Figure 5:
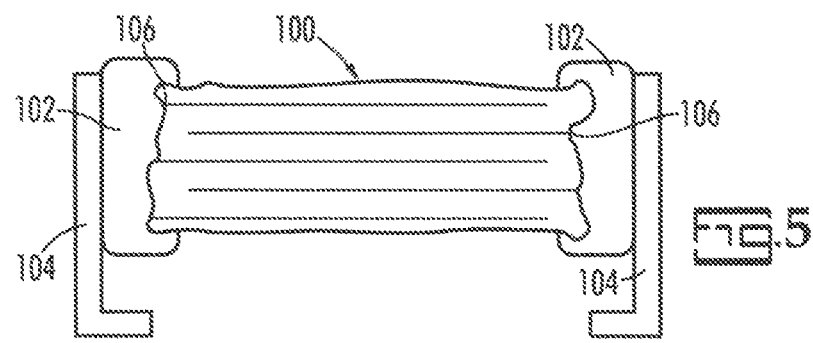
FIG. 5 is a side cross-sectional schematic view of an embodiment of the invention.

In FIG. 5 a cross-section of an electronic component is shown, in this case a multi-layer ceramic capacitor, 100, with transient liquid phase sintering conductive metallurgical bond terminations, 102, contacts through a conductive interconnect to external leads, 104. The edge, 106, has no continuous intimate line of contact between the conductive connection and the external leads. This invention does not require the two surfaces of the external lead and conductive interconnect when mated together to form a continuous line of intimate contact.

Figure 6:
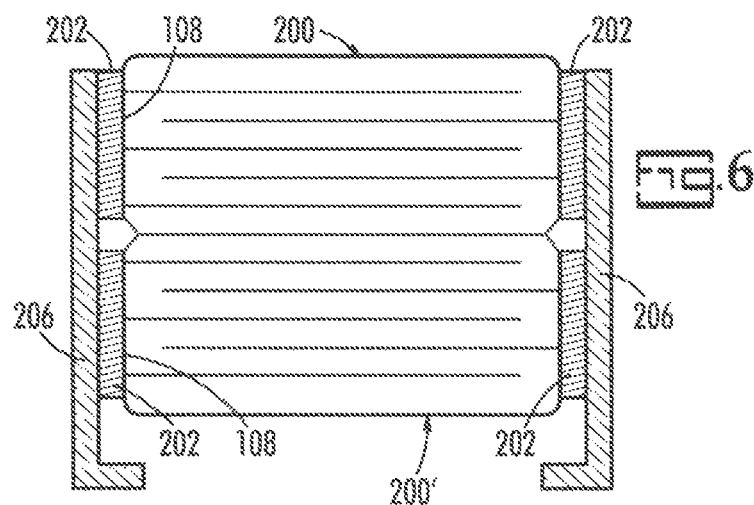
FIG. 6 is a side cross-sectional schematic view of an embodiment of the invention.

An embodiment of the invention is illustrated in FIG. 6. In FIG. 6, two MLCC's, 200 and 200', between lead frames, 206, are illustrated for the purposes of discussion with the understanding that many could be stacked. Each MLCC has a transient liquid phase sintering conductive termination, 202, which covers only a portion of the edges, 108, of the MLCC. This allows the MLCC's to be closely spaced with a minimum, or no gap, between the faces of the MLCC. In FIG. 6, the inner electrodes may be aluminum with the transient liquid phase sintering conductive terminations metallurgically bonded directly thereto. Furthermore the lead frames may be aluminum with the transient liquid phase sintering conductive terminations metallurgically bonded directly thereto.

Figure 7:
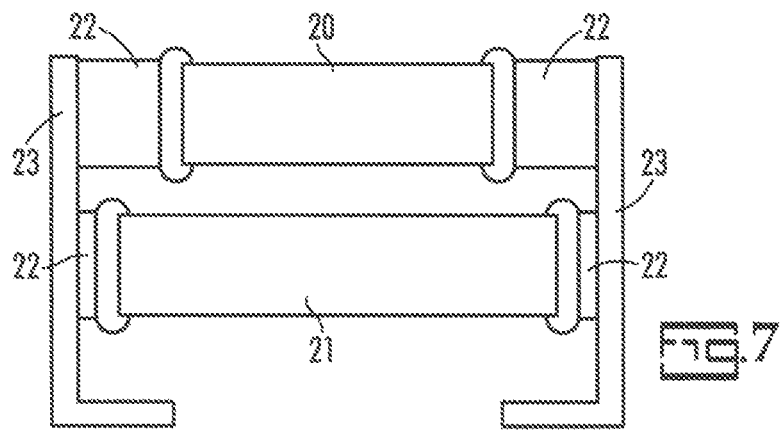
FIG. 7 is a cross-sectional schematic view of an embodiment of the invention.

An embodiment of the invention is illustrated in FIG. 7 as a schematic side view of stacked MLCC's wherein the two MLCC's, 20 and 21, have different widths. The transient liquid phase sintering conductive terminations, 22, can accommodate electronic components of differing lengths with adequate contact to the external leads, 23. In this way components of differing lengths up to 2.54 mm (0.10 inches) can be attached within the same stack even though it is preferable that the lengths differ by no more than 0.254 mm (0.010 inches).

Figure 8:
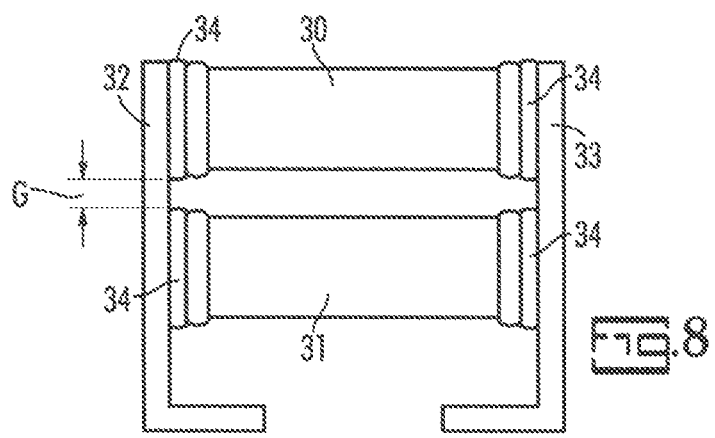
FIG. 8 is a side schematic view of stacked MLCC's.

FIG. 8 illustrates a cross-sectional schematic view of a stack of two components, 30 and 31, attached to external leads 32 and 33 using a conventional solder 34. In this case a gap, G, of at least 0.254 mm (0.010") is required between the components to allow for post assembly cleaning to remove solder balls.

Figure 9:
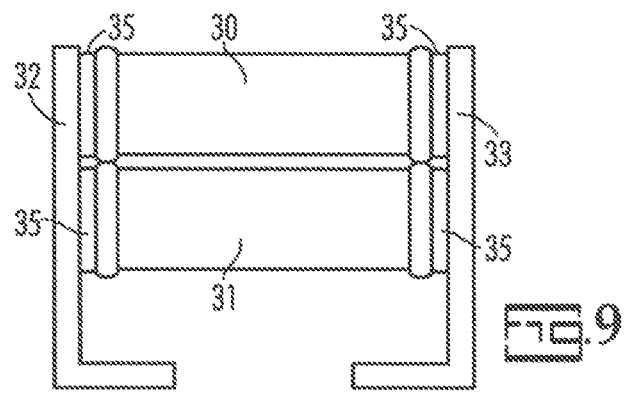
FIG. 9 is a side schematic view of an embodiment of the invention.

FIG. 9 illustrates, in cross-sectional side schematic view, an embodiment of this invention with a stack of two components, 30 and 31, attached to external leads, 32 and 33, using a transient liquid phase sintering conductive metallurgical bond, 35. In this case a gap of less than 0.254 mm, and preferably no gap, can be used between the components since no solder balls are formed and therefore cleaning is not required. Elimination of the gap allows an overall reduction in height of the stack thereby reducing the vertical space required for the electronic components. Furthermore, for stacks of more than two components the savings in space will be even greater. In FIG. 9 the components can be a capacitor, a battery, or any component comprising a conductive layer, and particularly, a aluminum conductive layer with a metallurgical bond formed by TLPS to the aluminum conductive layer as described herein. Alternatively, the external terminations may be aluminum with a metallurgical bond between the external terminations and the external lead which may also be aluminum.

Figure 16:
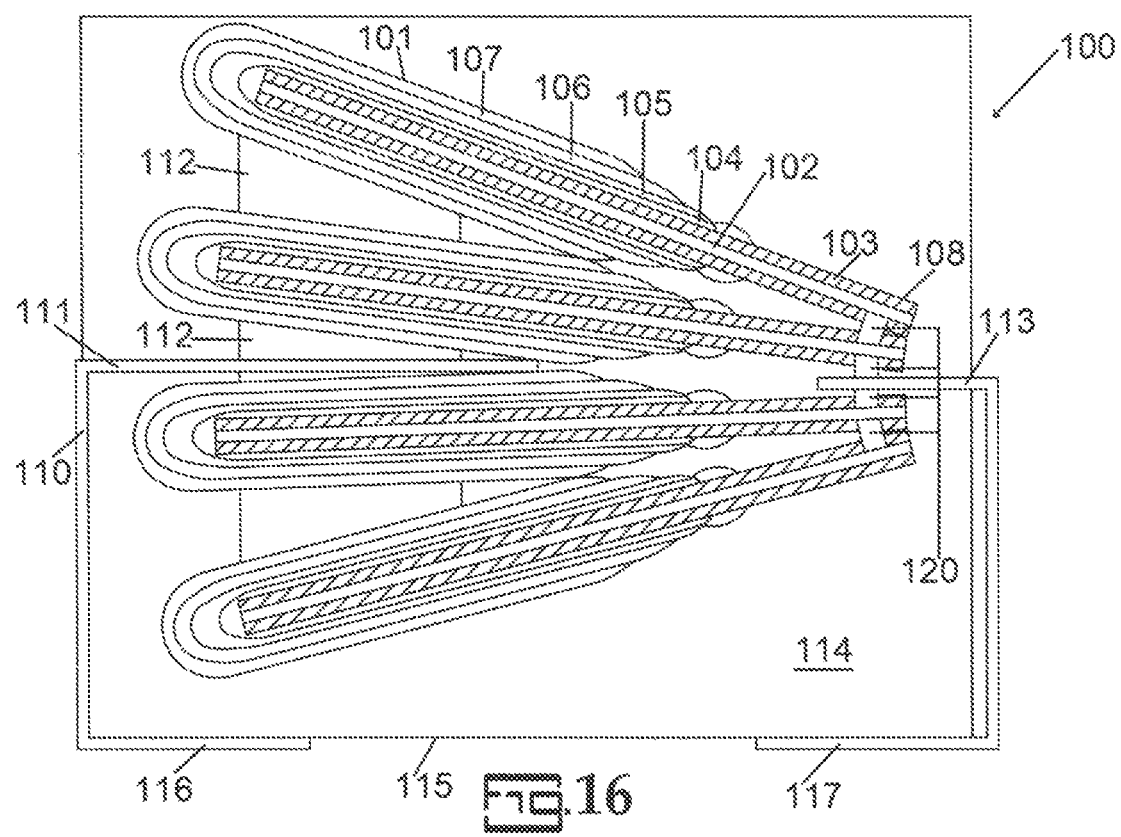
FIG. 16 is a cross-sectional view of an embodiment of the invention.
Figure 17:
FIGS. 17-20 illustrate the metallurgical bond between aluminum coupons with increasing magnification.
Figure 18:
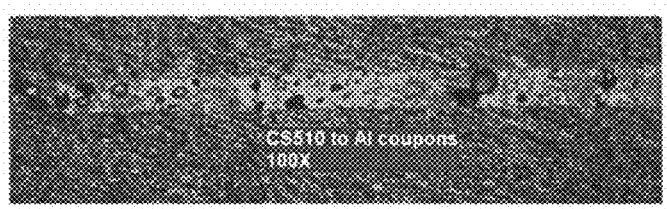
Figure 19:
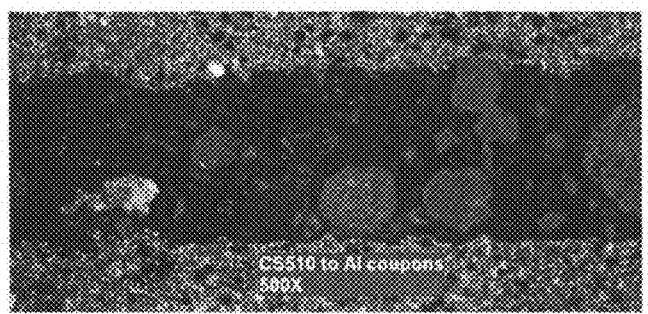
Figure 20:

An embodiment of the invention is illustrated in FIG. 16. In FIG. 16, a capacitor, 100, is illustrated in cross-sectional view. The capacitor comprises multiple capacitive elements, 101, constructed of a multiple capacitive elements, 101, that are constructed from an aluminum foil, 102, that has been processed to make its surfaces porous, 103. Over its entire surface, or just a portion of its surface, the porous aluminum foil is anodized to create a dielectric layer, 104. As would be understood surface oxide forms almost instantly on every uncovered surface of the aluminum anode and therefore the porous surface comprises aluminum oxide to some depth. The foil is then processed to create a conductive polymer layer, 105, over the dielectric layer. A protective carbon layer, 106, is then applied over the conductive polymer layer, and a silver paint layer or metal filled organic resin layer, 107, is applied over the carbon layer to provide a capability to collect the electrical current from the capacitive region of the anode element. There is also a region, 108, of the anode element that is preserved from any of the capacitive associated layers, which acts as an anode extension and serves as the conductive path for the anodic electrical current. Thus deriving a complete capacitive element, 100. These capacitive elements are attached to a leadframe structure, 110, where the cathodic portion of the capacitive element is adhered to the cathodic portion of the leadframe, 111, with silver adhesive, 112, and the anode extension, 108, is attached to the anodic portion of the leadframe, 113, by a TLPS wherein the TLPS is applied preferably without flux and the anode extensions are directly bonded without removal of the aluminum oxide layer yet the oxide layer is not visibly present after bond formation. Additional capacitive elements are stacked and attached by the same methods as the first capacitive element(s) to the leadframe extensions using TLPS, 120, preferably without flux or polymer and without prior removal of the aluminum oxide layer where the TLPS has at least 90 wt % metal. This structure is then preferably encapsulated in a thermosetting resin, 114. The leadframe extensions are processed to exist at the bottom surface of the encapsulant, 115, providing suitable mounting surfaces for soldering to a printed circuit board.

Figure 23:
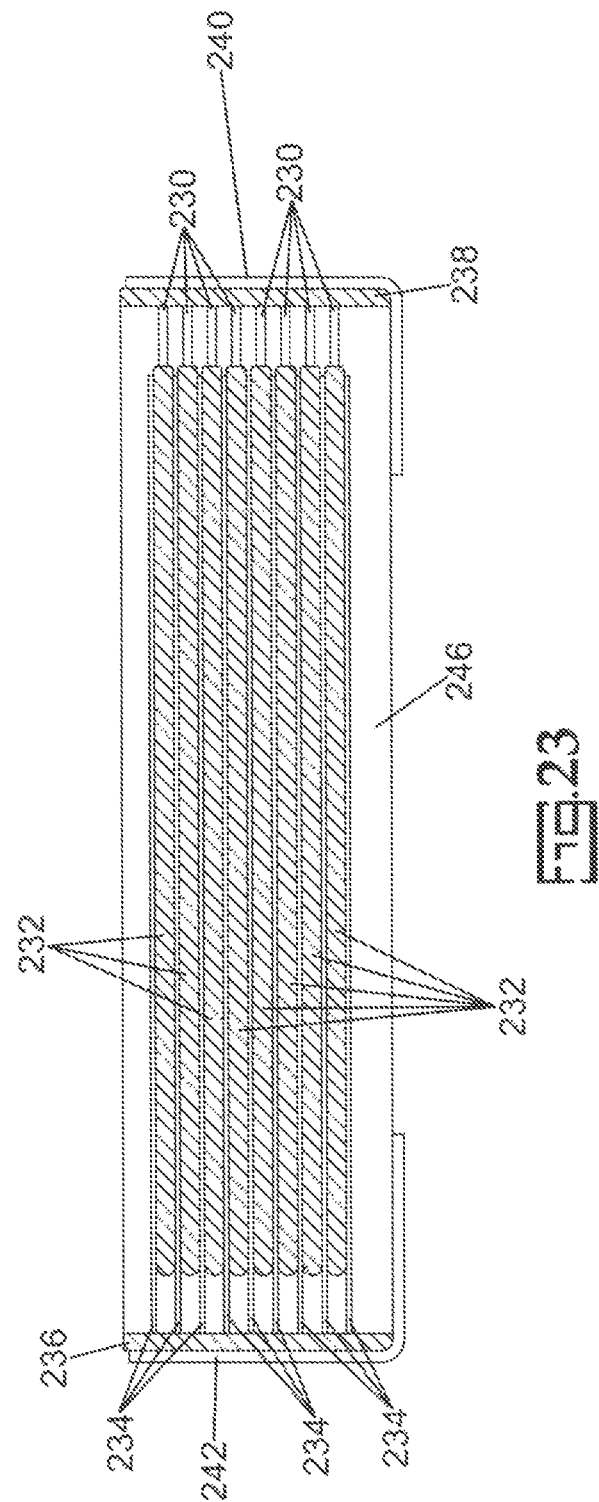
FIG. 23 is a cross-sectional view of an embodiment of the invention.

An embodiment of the invention is illustrated in cross-sectional schematic view in FIG. 23. In FIG. 23, a multiplicity of capacitive elements, as described relative to FIG. 16, are shown in a stack. Each capacitive element comprises an anode, 230, and cathode, 232. Cathode leads, 234, are interleaved with the capacitive elements to collect current from adjacent cathodes. The cathodes terminate at a cathode manifold, 236, which is in electrical contact with a cathode leadframe, 242. Anode leads, 230, extend from each anode and terminate at an anode manifold, 238. The anode manifold is in electrical contact with an anode leadframe, 240. The anode is preferably a foil or sheet and more preferably aluminum. The cathode leads, anode manifold, cathode manifold, cathode leadframe or anode leadframe may comprise aluminum and be bonded with a TLPS.

The cathode is a conductor preferably comprising at least one of manganese dioxide and a conductive polymeric material. Particularly preferred conductive polymers include intrinsically conductive polymers most preferably selected from polypyrrole, polyaniline and polythiophene. Metals can be employed as a cathode material with valve metals being less preferred. The cathode may include multiple interlayers wherein adhesion layers are employed to improved adhesion between the conductor and the termination. The final layer is preferably a solderable layer such as silver, nickel or copper. Particularly preferred adhesion interlayers include carbon, silver, copper, nickel or another conductive material in a binder.

EXAMPLES

The slump test is based on a visible observation, preferably with magnification, wherein the part is inspected after treatment to see if the MLCC has moved, or slumped, within the lead frame. Slumping indicates that the reflow process has caused the integrity of the bond to the lead frame to be compromised. A failure is indicated by a movement of the MLCC within the lead frame or a visual indication of a loss of bond integrity.

Example 1: Improved Mechanical Robustness of TLPS

Similar stacks were manufactured with silver or tin plated lead frames and attached with a Cu-based transient liquid phase sintering adhesive available as Ormet 328. The samples did not exhibit any slumping or external lead detachment. A load test was then conducted as described in U.S. Pat. No. 6,704,189 wherein the stacks were placed in an oven with a 30 g weight attached to the MLCC and suspended below the stack. The temperature was increased above 260° C. in steps of at least 10° C. with a 10 minute dwell at each temperature. The parts were then examined for slumping and or external lead detachment failures. In the case of silver plated external lead frames failures were detected at 630° C. but for Sn plated lead frames the first failures were detected at 360° C. demonstrating a superior high temperature mechanical performance for transient liquid phase sintering conductive metallurgical bond.

Example 2: Thermo-Compression Bonding

Figure 10:
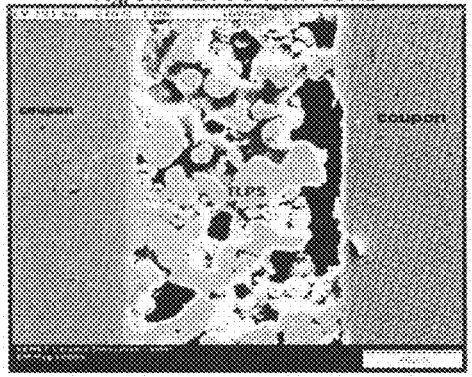
FIGS. 10 and 11 are electron micrographs of cross-sections of coupons bonded in accordance with an embodiment of the invention.
Figure 11:
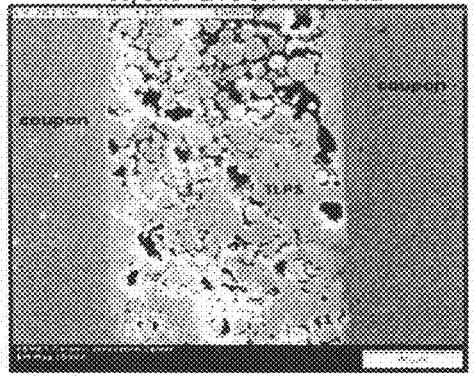
Figure 12:
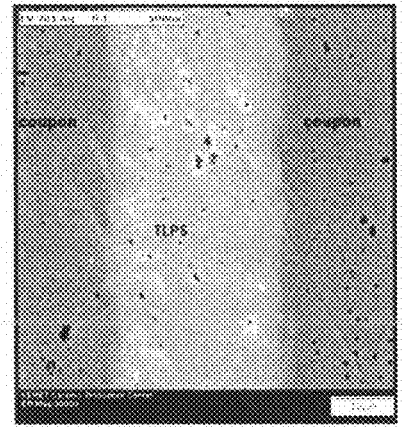
FIGS. 12 and 13 are electron micrographs of cross-sections of coupons bonded in accordance with an embodiment of the invention.
Figure 13:
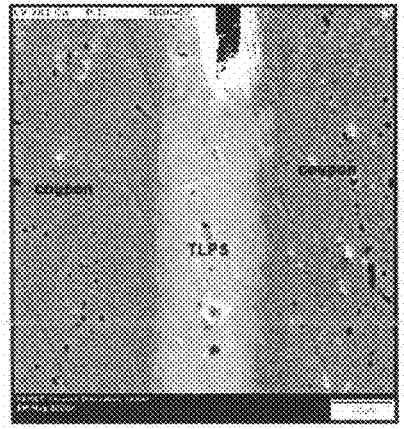

FIGS. 10 and 11 are photomicrographs demonstrating the bonds achieved using TLPS Ag/Sb/Bi, available as Ormet 701 Series, and Cu/Sb/Bi, available as Ormet 280 CE Series, to bond between coupons of Ag plated phosphor bronze using an IR reflow process. Significant areas of voids are present. FIG. 12 is a photomicrograph showing the TLPS Ag/Sb/Bi after a thermo-compression bonding process and FIG. 13 is a photomicrograph showing the Cu/Sb/Bi after a thermo-compression bonding process. In both instances a dense microstructure is observed. Thermo-compression can be achieved very quick such as less than 5 minutes with 2-10 pounds of compression.

Coupons were prepared in an analogous fashion to Example 4. A 30 g weight was suspended from the device thereby placing a stress on the thermo-compression bond. The bond was subjected to increasing temperatures. No failures were observed even with heating up to 850° C.

On observation, with lead attachments using Cu/Sn/Bi TLPS available as Ormet 701 and 10/88/2 Sn/Pb/Ag solder the TLPS remains where it was deposited whereas solder flows on heating. Solder requires the use of solder dams and resists when used with external lead attachment whereas TLPS does not. This provides a significant manufacturing advantage.

Figure 14:
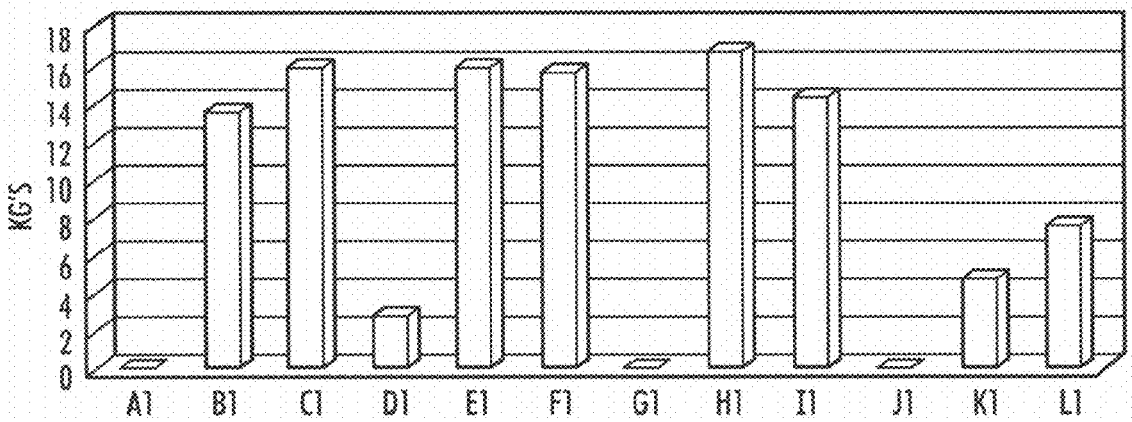
FIGS. 14 and 15 are graphical representations illustrating advantages provided by the invention.

FIG. 14 is a bar chart illustrating the results of a pull, or shear, test using Ormet 701 Cu/Sn/Bi TLPS to bond matte plated Sn Phosphor bronze coupons using thermo-compression bonding at various conditions with and without post curing. These results are compared to a 91.5Sn/8.5Sb solder. In FIG. 14, Sample A1 was heated at 180° C., for 20 seconds with no post curing, Sample 81 was heated at 180° C. for 15 sec. with a 20 minute post cure at 210° C. Sample C1 was heated at 180° C. for 20 sec. with a 30 minute post cure at 210° C. Sample D1 was heated at 190° C. for 20 sec. with no post cure. Sample E1 was heated at 190° C. for 20 sec. with a 15 minute post cure at 210° C. Sample F1 was heated at 190° C. for 20 sec. with a 30 minute post cure at 210° C. Sample G1 was heated at 200° C. for 20 sec. with no post cure. Sample H1 was heated at 200° C. for 20 sec. with a 15 minute post cure at 210° C. Sample 11 was heated at 200° C. for 20 sec. with a 30 minute post cure at 210° C. Sample J1 was heated at 200° C. for 10 sec. with no post cure. Sample K1 was heated at 230° C. for 10 sec. with no post cure. Sample L1 was heated at 210° C., mimicking a post cure, for 30 minutes using 91.5Sn/8.5Sb solder.

Example 3

Figure 15:
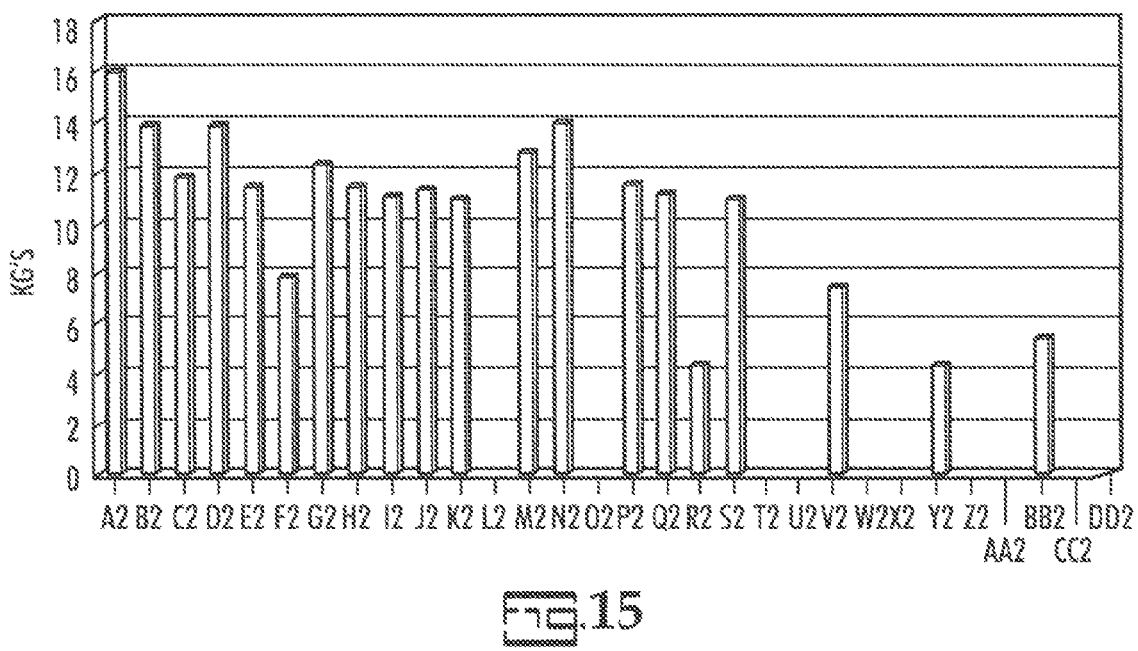

A set of experiments, similar to Example 2, was performed using Ormet 280CE Ag/Sn/Bi on a silver plated coupon. The results are provided in a bar graph in FIG. 15. In the examples the external lead exhibits a shear strength, measured as peak pull (in Kg) to failure, which exceeds the solder even though no post cure was used in the thermo-compression process. In each case the samples were heated at a first temperature for a first period of consistent with a preheat, then the temperature was ramped to a second temperature in three seconds and the samples were held at the second temperature for a period of time. In FIG. 15 Sample A2 was preheated at 140° C. for 10 sec., the temperature was ramped to 300° C. and held for 20 sec. Sample 82 was preheated at 140° C. for 10 sec., the temperature was ramped to 300° C. and held for 10 sec. Sample C2 was preheated at 140° C. for 10 sec., the temperature was ramped to 300° C. and held for 5 sec. Sample 02 was preheated at 140° C. for 3 sec., the temperature was ramped to 300° C. and held for 20 sec. Sample E2 was preheated at 140° C. for 3 sec., the temperature was ramped to 300° C. and held for 10 sec. Sample F2 was preheated at 140° C. for 3 sec., the temperature was ramped to 300° C. and held for 5 sec. Sample G2 was preheated at 140° C. for 10 sec., the temperature was ramped to 280° C. and held for 20 sec. Sample H2 was preheated at 140° C. for 10 sec., the temperature was ramped to 280° C. and held for 10 sec. Sample 12 was preheated at 140° C. for 10 sec., the temperature was ramped to 280° C. and held for 5 sec. Sample J2 was preheated at 140° C. for 3 sec., the temperature was ramped to 280° C. and held for 20 sec. Sample K2 was preheated at 140° C. for 3 sec., the temperature was ramped to 280° C. and held for 10 sec. Sample L2 was preheated at 140° C. for 3 sec., the temperature was ramped to 280° C. and held for 5 sec. Sample M2 was preheated at 140° C. for 10 sec., the temperature was ramped to 260° C. and held 20 sec. Sample N2 was preheated at 140° C. for 10 sec, ramped to 260° C. and held for 10 sec. Sample O2 was preheated at 140° C. for 10 sec., the temperature was ramped to 260° C. and held for 5 sec. Sample P2 was preheated at 140° C. for 3 sec., the temperature was ramped to 260° C. and held for 20 sec. Sample Q2 was preheated at 140° C. for 3 sec., the temperature was ramped to 260° C. and held for 10 sec. Sample R2 was preheated at 140° C. for 3 sec., the temperature was ramped to 260° C. and held for 5 sec. Sample S2 was preheated at 140° C. for 10 sec., ramped to 240° C. and held for 20 sec. Sample T2 was preheated at 140° C. for 10 sec., the temperature was ramped to 240° C. and held for 10 sec. Sample U2 was preheated at 140° C. for 10 sec., the temperature was ramped to 240° C. and held for 5 sec. Sample V2 was preheated at 140° C. for 3 sec., the temperature was ramped to 240° C. and held for 20 sec. Sample W2 was preheated at 140° C. for 3 sec., the temperature was ramped to 240° C. and held for 10 sec. Sample X2 was preheated at 140° C. for 3 sec., the temperature was ramped to 240° C. and held for 5 sec. Sample Y2 was preheated at 140° C. for 10 sec., the temperature was ramped to 220° C. and held for 20 sec. Sample Z2 was preheated at 140° C. for 10 sec., the temperature was ramped to 220° C. and held for 10 sec. Sample AA2 was preheated at 140° C. for 10 sec., the temperature was ramped to 220° C. and held for 5 sec. Sample 882 was preheated at 140° C. for 3 sec., the temperature was ramped to 220° C. and held for 20 sec. Sample CC2 was preheated at 140° C. for 3 sec., the temperature was ramped to 220° C. and held for 10 sec. Sample OO2 was preheated at 140° C. for 3 sec., the temperature was ramped to 220° C. and held for 5 sec.

Example 4: TLPS Termination

TLPS Cu/Sn/Bi, available as Ormet 701, was cured onto nickel base metal electrode MLCC's to form a termination directly to the nickel inner electrodes. The average capacitance was 0.32 µF similar to that for standard high fire termination materials indicating a bond with a continuous conductive pathway had been formed to the inner electrodes.

Example 5: Metallurgical Bond of Aluminum Oxide

Two aluminum coupons were bonded to determine the electrical conductivity of a bond formed without removal of the oxide either prior to bonding and without flux in the TLPS material. Copper tin with 50% tin was used as the TLPS. The TLPS was dispensed between a pair of aluminum coupons, each being 0.750" long and 0.150" wide, to give an overlap joint of 0.150"×0.150". Two identically prepared samples were sintered in an IR reflow oven below 350° C. to form TLPS bonds between the Al strips. A 4-point Kelvin probe capable of measurements down to approximately 0.1 to 1 mOhm was used to measure the electrical resistivity through these TLPS bonds and a comparative resistance was measured over a similar distance, 0.2" (5 mm), on similar Al strips. The resistance for the two samples with the TLPS overlap joint was <0.2 mOhms which compares favorably to the resistance of Al strips which were <0.1 mOhm. Although the aluminum had lower electrical resistivity the TLPS joints made with TLPS material still had a low electrical resistance. This demonstrates that the TLPS does provide a highly electrical conductive joint even when bonding to Al without prior removal of the oxide either mechanically or by incorporation of a flux in the TLPS material.

Figure 21:
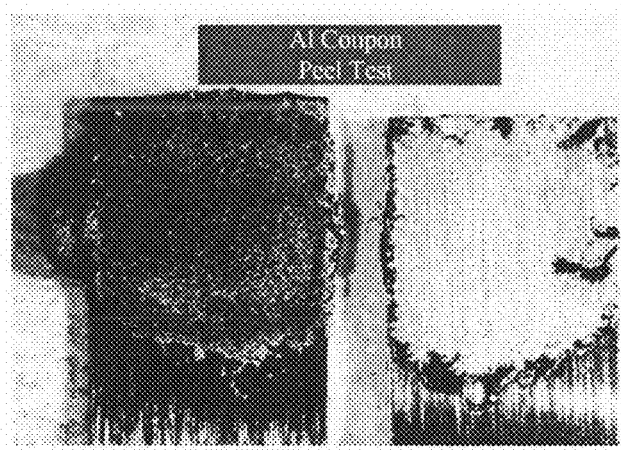
FIGS. 21 and 22 illustrate the results after peel and shear test.
Figure 22:
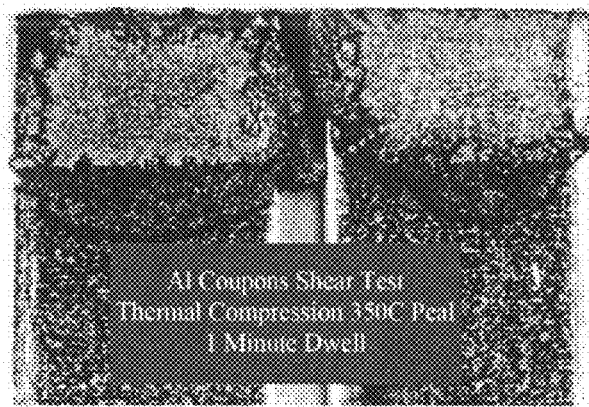

Table 1 shows the average shear strength of the bond joint. Two aluminum coupons joined as in Example 5 with a 0.150" by 0.150" overlap joint were subjected to a shear tests with the results reproduced in Table 1. Table 2 summarizes the results of a pull peel test when two aluminum coupons were bonded together as in Example 59 with the leads bent outward 90 degrees to each other and then pulled creating a peel effect. The peel results were normalized to a 1 inch length. SEM's are provided in FIGS. 17-20 show progressively higher magnifications from 50× to 1000× of the cross section of a lap joint of two aluminum coupons joined together with TLPS wherein one coupon may represent a heat sink. FIGS. 21 and 22 illustrate Peel Sample 3 and Shear Sample 4 after testing.

TABLE 1

Shear Strength

| Sample | Load | Area | Shear Strength |
|---|---|---|---|
| 1 | 13.6975 | 0.0084 | 1630.65 |
| 2 | 15.9418 | 0.0096 | 1660.60 |
| 3 | 16.6333 | 0.0102 | 1630.72 |
| 4 | 16.2371 | 0.0102 | 1591.87 |

In Table 1 the load is in pounds, area is in square inches and shear strength is in pounds per square inch.

TABLE 2

Peel Test

| Sample | Load | Width | Peel |
|---|---|---|---|
| 1 | 0.1776 | 0.15 | 1.184 |
| 2 | 0.2987 | 0.15 | 1.99 |
| 3 | 0.1757 | 0.15 | 1.17 |
| 4 | 0.1338 | 0.15 | 0.892 |

In Table 2 load is in pounds, width is inches and peel is pounds per inch.

The invention has been described with reference to the preferred embodiments without limit thereto. One of skill in the art would realize additional embodiments and alterations which are not specifically set forth but which are within the scope of the claims appended hereto which form an integral part of the instant application.

The invention claimed is:

1. A method for forming a capacitor comprising:
   providing an aluminum containing anode with an aluminum oxide dielectric thereon;
   forming a cathode on a first portion of said aluminum oxide dielectric;
   bonding an anode lead to said aluminum anode on a second portion of said aluminum oxide by a transient liquid phase sintered conductive material thereby metallurgical bonding said aluminum anode to said anode lead; and
   bonding a cathode lead to said cathode.

2. The method for forming a capacitor of claim 1 wherein said transient liquid phase sintered conductive material has at least 90 wt % metal.

3. The method for forming a capacitor of claim 2 wherein said transient liquid phase sintered conductive adhesive has at least 95 wt % metal.

4. The method for forming a capacitor of claim 1 wherein said bonding of said anode lead includes heating to a first temperature followed by heating to a second temperature.

5. The method for forming a capacitor of claim 1 wherein said metallurgical bond comprises a copper aluminum alloy.

6. The method for forming a capacitor of claim 1 wherein said transient liquid sintering material comprises a high melting temperature component and a low melting temperature component.

7. The method for forming a capacitor of claim 6 wherein said high melting temperature component of the transient liquid phase sintering material comprises at least one member selected from the group consisting of copper, silver, aluminum, gold, platinum, palladium, beryllium, rhodium nickel, cobalt, iron and molybdenum or an alloy of said member.

8. The method for forming a capacitor of claim 6 wherein said low melting temperature component of the transient liquid phase sintering material comprises at least one member selected from the group consisting of tin, antimony, bismuth, cadmium, zinc, gallium, indium, tellurium, mercury, thallium, selenium and polonium or an alloy said member.

9. The method for forming a capacitor of claim 1 wherein said transient liquid phase sintered conductive material comprises copper and tin.

10. The method for forming a capacitor of claim 9 wherein said transient liquid phase sintered conductive material comprises at least 60 wt % a copper/tin portion and no more than 40 wt % as secondary portion.

11. The method for forming a capacitor of claim 9 wherein said transient liquid phase sintered conductive material comprises at least 10 wt % to no more than 70 wt % copper and at least 30 wt % to no more than 90 wt % tin.

12. The method for forming a capacitor of claim 11 wherein said secondary portion comprises a material selected from the group consisting of silver, aluminum, gold, platinum, palladium, beryllium, rhodium, nickel, cobalt, iron, molybdenum, antimony, bismuth, cadmium, zinc, gallium, indium, tellurium, mercury, thallium, selenium, polonium, and a non-volatile filler.

13. The method for forming a capacitor of claim 12 wherein said non-volatile filler is selected from ceramics, glasses and polymers with a melting point such above 300° C.

14. The method for forming a capacitor of claim 1 wherein at least one of said anode lead or said cathode lead is plated with a material comprising at least one of nickel, copper, gold, silver, tin, palladium and lead.

15. The method for forming a capacitor of claim 1 wherein at least one of said anode lead or said cathode lead is a non-ferrous material or a ferrous material.

16. The method for forming a capacitor of claim 15 wherein said non-ferrous material is selected from aluminum, copper, phosphor bronze, brass and beryllium copper.

17. The method for forming a capacitor of claim 15 wherein said ferrous material is selected from Alloy 42 and Kovar.

18. The method for forming a capacitor of claim 1 wherein said transient liquid phase sintering material does not comprise lead.

19. The method for forming a capacitor of claim 1 wherein said bonding does not include removing said aluminum oxide dielectric.

20. The method for forming a capacitor of claim 1 wherein said cathode comprises a conductive polymer.

* * * * *